(12) United States Patent
Gueissaz et al.

(10) Patent No.: US 7,601,537 B2
(45) Date of Patent: Oct. 13, 2009

(54) METHOD OF CHECKING THE HERMETICITY OF A CLOSED CAVITY OF A MICROMETRIC COMPONENT AND MICROMETRIC COMPONENT FOR THE IMPLEMENTATION OF SAME

(75) Inventors: François Gueissaz, Wavre (CH); Jean-Paul Randin, Cortaillod (CH)

(73) Assignee: Asulab S.A., Marin (CH)

( * ) Notice: Subject to any disclaimer, the term of this patent is extended or adjusted under 35 U.S.C. 154(b) by 340 days.

(21) Appl. No.: 10/595,946

(22) PCT Filed: Nov. 8, 2004

(86) PCT No.: PCT/EP2004/012626

§ 371 (c)(1), (2), (4) Date: May 22, 2006

(87) PCT Pub. No.: WO2005/049482

PCT Pub. Date: Jun. 2, 2005

(65) Prior Publication Data

US 2007/0196923 A1 Aug. 23, 2007

(30) Foreign Application Priority Data

Nov. 21, 2003 (EP) .................................. 03026780

(51) Int. Cl.
*G01N 31/00* (2006.01)
(52) U.S. Cl. ..................... 436/3; 436/1; 436/2; 73/40.7; 73/49.3
(58) Field of Classification Search ............... 436/1–3; 73/40.7, 49.3
See application file for complete search history.

(56) References Cited

U.S. PATENT DOCUMENTS 4,224,565 A 9/1980 Sosniak et al.

(Continued)

FOREIGN PATENT DOCUMENTS

EP 0 874 379 A1 10/1998

(Continued)

OTHER PUBLICATIONS

International Search Report issued in corresponding application No. PCT/EP2004/012626 completed Feb. 17, 2005 and mailed Mar. 1, 2005.

(Continued)

*Primary Examiner*—Jill Warden
*Assistant Examiner*—Jameson Q Ma
(74) *Attorney, Agent, or Firm*—Griffin & Szipl, P.C.

(57) ABSTRACT

In order to check the hermeticity of a closed cavity of at least one micrometric component, said component includes a structure made over or in one portion of a substrate, a cap fixed to one zone of the substrate to protect the structure, and an indicator element whose optical or electrical properties change in the presence of a reactive fluid. The indicator element may be a copper layer for an optical check or a palladium resistor for an electrical check. The micrometric component is placed in a container which is then hermetically closed. This container is filled with a reactive fluid under pressure, which is oxygen for the optical check and hydrogen for the electrical check. The component in the container is subjected to a reactive fluid pressure higher than 10 bars for a determined time period, and to thermal (T>100° C.) or optical (λ<500 nm) activation. After this time period, an optical or electrical check of the indicator element determines the hermeticity of said cavity.

8 Claims, 5 Drawing Sheets

U.S. PATENT DOCUMENTS

| | | | |
|---|---|---|---|
| 4,282,744 A | 8/1981 | Dick | |
| 4,920,785 A * | 5/1990 | Etess | 73/40.7 |
| 5,307,139 A | 4/1994 | Tyson et al. | |
| 6,223,586 B1 | 5/2001 | Dierenbach et al. | |
| 6,763,702 B2 * | 7/2004 | Chien et al. | 73/40.7 |
| 2002/0096421 A1 | 7/2002 | Cohn et al. | |

FOREIGN PATENT DOCUMENTS

| | | |
|---|---|---|
| EP | 1 310 380 A1 | 5/2003 |

OTHER PUBLICATIONS

Waelti, M. et al., "Package Quality Testing Using Integrated Pressure Sensor", 1998 International Symposium on Microelectronics, pp. 981-986.

Nese, Martin et al., "New Method for Testing Hermeticity of Silicon Sensor Structures", The 8th International Conference on Solid-State Sensors and Actuators, and Eurosensors IX, 1995, pp. 260-262.

* cited by examiner

METHOD OF CHECKING THE HERMETICITY OF A CLOSED CAVITY OF A MICROMETRIC COMPONENT AND MICROMETRIC COMPONENT FOR THE IMPLEMENTATION OF SAME

This is a National Phase Application in the United States of International Patent Application No. PCT/EP2004/012626 filed Nov. 8, 2004, which claims priority on European Patent Application No. 03026780.1, filed Nov. 21, 2003 The entire disclosures of the above patent applications are hereby incorporated by reference.

FIELD OF THE INVENTION

The invention concerns a method of checking the hermeticity of a closed cavity of at least one micrometric component. The micrometric component includes a structure made on or in a portion of a substrate and a cap fixed onto one zone of the substrate for protecting the structure. The cavity of the micrometric component is delimited by the inner surface of the cap, the structure and the substrate zone. This cavity can be filled for example with an inert gas at a pressure close to atmospheric pressure or can be a vacuum cavity.

The invention also concerns the micrometric component with a closed cavity for implementing the checking method. The structure made in or on a portion of the substrate can be an integrated circuit or a three-dimensional structure or a combination of an integrated circuit and a three-dimensional structure.

BACKGROUND OF THE INVENTION

"Three-dimensional structures" of these micrometric components mean micro-optoelectromechanical devices (MOEMS) or microelectromechanical (MEMS) devices, such as reed contactors, accelerometers, micro-motors, quartz resonators, sensors of micrometric size that have to be left to move freely after encapsulation in a controlled atmosphere. The construction of these three-dimensional structures of the micrometric components can occur on an insulating substrate or on a semi-conductor substrate in which integrated circuits have, for example, been made beforehand. In this latter case, it is possible to take the metallic contact pads of the integrated circuits to start the deposition of the metallic layers that will, in part, form the structure of the micrometric component and enable it to be electrically connected to said circuit.

EP Patent No. 0 874 379 by the same Applicant discloses a micro-contactor with micrometric sized strips as an example of a three-dimensional structure and the method of making the same. The contactor includes metallic strips that are at a distance from each other in the rest state and which are made by electrolytic means in several steps and secured to a substrate. The strips are formed of an iron and nickel alloy deposited by an electrolytic method. This alloy has the property of being ferromagnetic so that the strips can be put into contact with each other when a magnetic field passing through them creates an attraction force between them. At least one aperture or constriction is made on at least one of the strips to facilitate bending of the strip.

The method of checking hermeticity has to be able to detect a leakage rate from very small closed cavities of micrometric components whose volume is less than 1 mm$^3$, for example of the order of 0.02 mm$^3$. Long equalization time constants of at least 20 years must be guaranteed for the closed cavity of these micrometric components in order for the structure of each component to be protected from any contaminating fluid. The contaminating fluid can be a liquid or a gas.

When the cap of the micrometric component is fixed onto the substrate to enclose the structure to be protected, microcracks may be observed, liable to allow an external contaminating liquid or gas to penetrate the cavity and contaminate said structure.

In order to check hermeticity or detect leakage from a closed cavity of a component via a conventional method, a checking gas has to be introduced into the cavity. In order to do this, said component has to be placed in a container or an enclosure which is filled with a gas, such as helium at a high pressure in order to accelerate the introduction of the gas into said cavity. However, one drawback of this method is that the measuring gas introduced into the cavity is liable to escape partially or entirely if there is a large leak, which can distort the hermeticity check which is conventionally carried out using a mass spectrometer.

Another drawback of the conventional method is that the leakage detection threshold of a mass spectrometer system is of the order of $5 \cdot 10^{-12}$ mbar·l/s. This means that the maximum leakage rates of the order of $10^{-15}$ to $10^{-14}$ mbar·l/s, which guarantee equalization constants of at least 20 years for cavities with a volume of less than 1 mm$^3$, cannot be detected.

U.S. Pat. No. 6,223,586 discloses a method of inspecting leaks from electronic components, such as microelectromechanical devices having a closed cavity. In order to do this, plates of such electronic components are placed first of all in a liquid bath under pressure for a determined time period. The liquid under pressure can be water for example. Once this step is finished, the components are placed in another liquid and an inspection can be carried out via microscope to detect areas of leakage in the cavities of the components. This other liquid may also be water so as to prevent the water inside the cavity evaporating. Another major drawback of this method lies in the fact that the hermeticity checking sensitivity is greatly reduced.

The main object of the invention is therefore to overcome the drawbacks of the prior art by providing a cumulative type method of checking the hermeticity of a closed cavity of at least one micrometric component, with remarkably increased sensitivity. This method has the capacity to reveal large leakages in a single detection operation. Means are thus provided in each cavity in order to react with a quantity of fluid that has penetrated the cavity during a determined period of time for checking hermeticity.

SUMMARY OF THE INVENTION

The invention therefore concerns a method of measuring the hermeticity of a closed cavity of at least one micrometric component cited hereinbefore, which is characterized in that it includes steps of:

placing the micrometric component in a container, said component comprising inside a cavity a hermeticity check indicator element whose optical or electrical properties change permanently in the presence of a reactive fluid capable of reacting with the indicator element;

hermetically sealing the container which includes said component;

filling the container with a reactive fluid under pressure in order to subject said component to a higher fluid pressure than the pressure in the cavity during a determined period of time, such as several days, the container including means for introducing the reactive fluid, and checking the variation in the properties of the indicator element by optical or electrical means depending upon the quantity of reactive fluid that has penetrated the cavity and reacted with the indicator element to determine the hermeticity of said cavity.

One advantage of the method of checking the hermeticity of the cavity according to the invention, lies in the fact that the indicator element placed in the cavity allows a certain quantity of reactive fluid that has penetrated the closed cavity to be absorbed or to react. Consequently, the indicator element cumulates the effect of this quantity of fluid that has penetrated the cavity and its optical or electrical properties are thus permanently altered. Because of this, a large leak or a small leak can be checked in the same way in a single operation using the hermeticity checking method.

Preferably, several wafers, which each include several micrometric components made on the same substrate and having a plate of caps fixed onto the substrate to close each structure of the micrometric components, can be placed in the container. In order to reduce the checking time for a multitude of micrometric components, the wafers are all subjected to the reactive fluid pressure in the container for a determined period of time. These wafers can be placed in the container at the end of the manufacturing process of said wafers and before or after electric test operations on each component. In each cavity of the micrometric components, an inert gas, such as argon, at a pressure close to atmospheric pressure, can protect each structure.

Advantageously, the container filled with reactive fluid can be heated to a temperature higher than the ambient temperature, preferably to a temperature higher than 100° C. by heating means during the determined time period. This accelerates the reaction of the reactive fluid that has penetrated each cavity with the indicator element. This reaction acceleration can also be obtained using ultraviolet illumination (UV).

Advantageously, the container is filled with a reactive gas under a pressure that is preferably greater than 10 bars, for example 15 bars so as to accelerate the introduction of the reactive gas in the cavities of the components. Since an equalization time of at least 20 years has to be guaranteed for these micrometric components, the determined time period for checking hermeticity can thus be reduced to several days with a pressure of 15 bars. This enables a sufficient quantity of gas to be introduced into each cavity to react in a measurable way with the indicator element, even if the final concentration of the gas in the cavity remains less than 1%.

For a check via optical means, the indicator element of each cavity can be a thin layer of copper or titanium, and the reactive gas is oxygen so that the copper or titanium layer oxidises as a function of the quantity of oxygen that has penetrated the cavity. The thickness of the copper or titanium layer, which is placed on the substrate or under the cap, can be less than 100 nm, preferably equal to 30 nm. The copper or titanium layer changes colour and transparency when it oxidises at a determined wavelength of at least one light beam emitted by a light source. If the substrate and/or the cap of each component are made of a transparent material, the wavelength of the beam can be close to the infrared range, for example equal to 850 nm. If the substrate and/or the cap of each component are made of semi-conductor material such as silicon, the wavelength of the beam can be increased to 1.3 µm to pass therethrough without being absorbed.

For a check via electrical means, the indicator element of each cavity is for example a palladium resistor, and the reactive gas is hydrogen. The resistor is connected by conductive paths passing through the micrometric component for a resistance measurement from the exterior of each component.

The invention also concerns a micrometric component suitable for implementing the aforementioned method, which is characterized in that it includes an indicator element inside the cavity for checking hermeticity, whose optical or electrical properties change permanently in the presence of a reactive fluid capable of reacting with the indicator element in order to check the hermeticity of the cavity of said component.

Advantageously, the indicator element is a copper or titanium layer for a check via optical means for reacting with oxygen as the reactive fluid, or a palladium resistor for a check via electrical means for reacting with hydrogen as the reactive fluid. The cavity of each component is preferably filled with an inert gas, such as argon at a pressure close to the atmospheric pressure.

Of course, the indicator element, particularly for an optical check, can be chosen from among other metal materials, such as silver, zirconium or niobium.

For a check via optical means, the indicator element is formed of a layer of copper or titanium selectively etched or selectively deposited via evaporation under vacuum through a mask on one part of the inner surface of the cap or on one part of the substrate area prior to the operation of fixing the cap onto an area of the substrate. The thickness of this layer of copper or titanium is comprised between 10 and 100 nm, preferably substantially equal to 30 nm. If the indicator element is of circular shape, the diameter of the copper or titanium layer is comprised between 10 and 100 µm, preferably 70 µm.

BRIEF DESCRIPTION OF THE DRAWINGS

The objects, advantages and features of the method of measuring the hermeticity of a cavity of a micrometric component, and of said micrometric component, will appear more clearly in the following description of embodiments of the invention with reference to the drawings, in which.

DETAILED DESCRIPTION OF THE ILLUSTRATIVE EMBODIMENTS

In the following description, the means for implementing the hermeticity checking method for a closed cavity of at least one micrometric component, which are well known to those skilled in the art, are shown and explained in a simplified manner.

Figure 1:
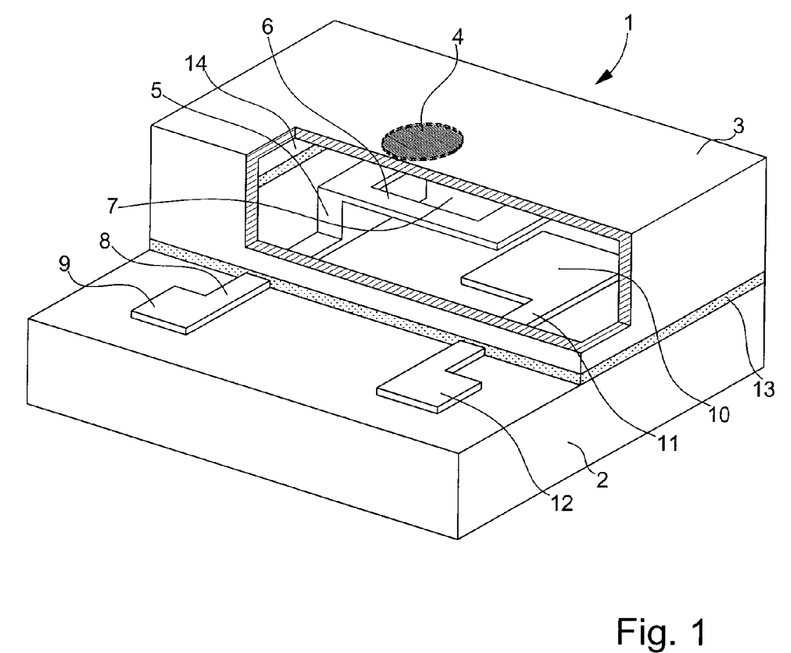
FIG. 1 shows a three-dimensional partial cross-section of a micrometric component showing a magnetostatic micro-contactor, according to a first embodiment, in which an indicator element can be checked via optical means for the hermeticity check.

FIG. 1 shows a first preferred embodiment of a micrometric component 1 for implementing the hermeticity checking method via optical means. Said micrometric component 1, shown in FIG. 1, comes from a wafer of several micrometric components, which are made on the same semi-conductor substrate 2, such as silicon or glass, after the operation of dicing said wafer. However, for the hermeticity checking method for a closed cavity 14 of at least one micrometric component 1, it may be a separate component from the wafer or at least one component of the wafer prior to a dicing operation. The wafer, which is not shown in FIG. 1, can include thousands of micrometric components.

Micrometric component 1 includes a three-dimensional structure 5, 6 and 10 made over one portion of a substrate 2, a cap 3 for protecting the structure fixed onto a zone of substrate 2 and an indicator element 4 sensitive to a specific reactive fluid. The indicator element 4 is placed on a top part of the inner surface of cap 3 in this first embodiment. A closed cavity 14 is delimited by the inner surface of cap 3, the three-dimensional structure 5, 6 and 10 and the zone of substrate 2.

The volume of one cavity 14 of such a micrometric component 1 is of the order of 0.02 mm$^3$ (1000 µm long, 200 µm wide and 100 µm high). This cavity 14 with a very small volume is preferably filled with an inert gas, such as argon, at a pressure close to atmospheric pressure.

The three-dimensional structure 5, 6 and 10 can be a magnetic micro-contactor. For technical details regarding the making of this micro-contactor, the reader can refer to EP Patent No. 0 874 379 by the same Applicant which is cited herein by way of reference.

This micro-contactor is formed of a first conductive strip 6, one end of which is secured to substrate 2 via a conductive foot 5, and the other end of the first strip is free to move, and a second conductive strip 10 fixed onto the substrate. Each metal strip 6 and 10, and conductive foot 5 can be obtained by an electrolytic method. In the presence of a magnetic field, the free end of first strip 6 can come into contact with the second strip 10.

A first conductive path 8 connects conductive foot 5 of the first strip 6 to a first electric contact terminal 9 placed outside cavity 14 on substrate 2. A second conductive path 11 connects second strip 10 to a second electric contact terminal 12 placed outside cavity 14 on substrate 2. Each contact terminal 9 and 12 can be connected to the contact terminals of an electronic circuit or to contact terminals of an electronic apparatus. An integrated circuit that is not shown can be made underneath the micro-contactor and electrically connected to each metal strip 6 and 10 of said micro-contactor. Of course, the electric connection of the micro-contactor to the exterior of cavity 14 can also be achieved via metallized holes through substrate 2 or any other manner different to that shown in FIG. 1.

An intermediate part of first strip 6 of the micro-contactor has an aperture 7 extending over most of its length to facilitate the bending of strip 6. The distance separating foot 5 of first strip 6 and one end of second strip 10 approximately corresponds to the length of aperture 7.

The indicator element 4, used for checking the hermeticity of closed cavity 14 of micrometric component 1, is preferably a copper layer, but can also be a titanium layer, which is placed at a distance from and opposite aperture 7. This copper or titanium layer can be obtained by selective chemical etching or by selective vapour deposition over a top part of the inner surface of the cap before cap 3 is secured to substrate 2. The chemical etching technique may be difficult to implement to make the copper or titanium layer in a cavity. It is thus preferable to use technique of deposition by evaporation under vacuum of copper or titanium in this first embodiment. Preferably, a copper layer is deposited which is then easy to achieve with this deposition method.

Of course, deposition by evaporation under vacuum of the copper layer or the titanium layer can be carried out during the steps of manufacturing the wafers of micrometric components. In order to do this, caps are first of all made for example by chemical etching in a glass or silicon plate. After this step, the copper or titanium layer is selectively deposited at the same time on the inner surface of caps 3 of at least one plate of caps through a mask in which holes are made of substantially equal dimensions to the dimension of the copper layer to be deposited. The mask used can be for example a photo-structurable glass mask of the Foturan type from the Schott Glas company in Germany.

Once the copper layers have been selectively deposited on each inner surface of caps 3 of the plate of caps, the plate is fixed onto substrate 2 of the wafer. Thus, each cap 3 of the plate is fixed onto each corresponding zone of substrate 2 in order to enclose a respective micro-contactor of the wafer to be protected. This plate of caps can be made for example of glass or silicon.

The thickness of this copper layer is comprised between 10 and 100 nm, preferably substantially equal to 30 nm to allow a light beam of determined wavelength to pass through said layer for a hermeticity check via optical means. It should be noted that the smaller the thickness of the copper layer, the greater the sensitivity, but with decreased contrast. A compromise thus had to be found between contrast and sensitivity, which means that the thickness of the copper layer was preferably chosen to be equal to 30 nm.

The surface dimension of the copper layer can be of smaller dimension than the surface dimension of aperture 7 of the micro-contactor. This allows first and second measuring zones to be defined through aperture 7, as explained hereinafter with reference particularly to FIGS. 5 and 6. If said layer has a circular surface, the diameter of the layer can be approximately 70 µm so that it can be easily measured via optical means using conventional means. Thus, each copper layer 4 deposited on the inner surface of each cap 3 has a mass of approximately 1.03 ng or 1.63·10$^{-11}$ mole.

Cap 3 or each cap of the plate of caps is fixed onto each zone of substrate 2 via an annular glas frit sealing gasket or preferably a metal alloy ring 13. The metal alloy can be an alloy composed of gold and tin (Au—Sn) with a melting point of the order of 280° C. Of course, the metal alloy chosen must provide proper adherence to the materials chosen for substrate 2 and cap 3. Before securing the cap via this metal alloy, a conventional insulating layer has to be provided, not shown, on conductive paths 8 and 11.

Figure 2:
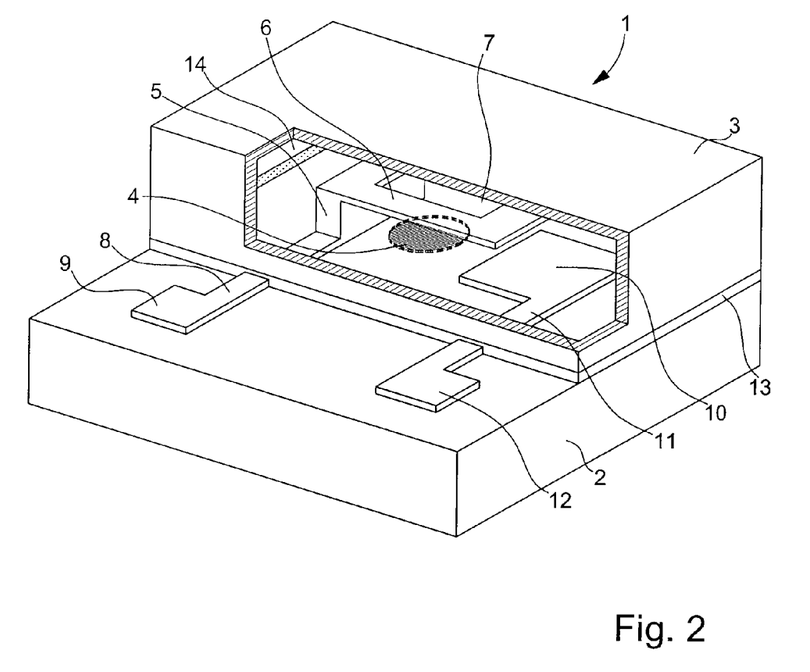
FIG. 2 shows a three-dimensional partial cross-section of a micrometric component showing a magnetostatic micro-contactor, according to a second embodiment, in which an indicator element can be measured via optical means for the hermeticity check.

FIG. 2 shows a second preferred embodiment of a micrometric component 1 for implementing the hermeticity checking method via optical means. It should be noted that those elements of FIG. 2, which are the same as those of FIG. 1, bear identical reference signs. Consequently for the sake of simplification, the description of these elements will not be repeated.

The essential difference of this second embodiment as regards the first embodiment of the micrometric component is the fact that the copper or titanium layer 4 is made directly on substrate 2 for example before the micro-contactor is made. This copper or titanium layer 4 is positioned opposite aperture 7. The surface dimension of the layer is less than the surface dimension of the aperture. This enables first and second measuring zones to be defined through the aperture for a check via optical means in the vertical direction of the component.

It is possible to make the copper or titanium layer 4 by selective chemical etching or deposition techniques by evaporation under vacuum as explained hereinbefore. It should be noted that chemical etching in this second embodiment can also be used given that the copper layer is made on a flat surface of substrate 2, for example on an insulating layer.

Since the copper or titanium layers of this second embodiment are made during manufacturing of the wafers on the substrates, the manufacturing time of said wafers may be slower than the manufacturing time of the wafers of the first embodiment of the micrometric components. However, the dimensions of this copper or titanium layer for each cap 3 may be equal to those mentioned in the first embodiment.

Figure 3:
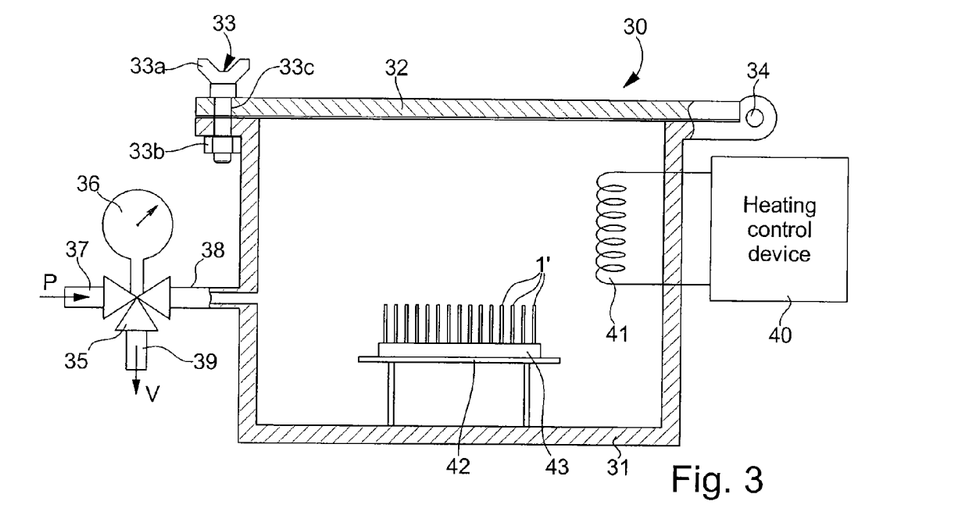
FIG. 3 shows in a simplified manner a vertical cross-section of a thermal container in which wafers of micrometric components are placed for implementing the hermeticity checking method according to the invention.

With reference to FIG. 3, a thermal container 30 is shown in a very simplified manner for the explanation of the first steps of the method of checking the hermeticity of several micrometric components. Of course, all of the elements of the container can take different forms from those shown in FIG. 3, provided that the first steps of the method can be carried out as normal.

Thermal container 30 essentially includes a tub 31 and a cover 32 hinged about an axis of rotation 34 at the mouth of tub 31. Closing means 33 are provided for hermetically sealing container 30 by applying cover 32 to the top edge of tub 31. These closing means 33 are for example formed by a screw 33a, whose head abuts against a top surface of cover 32, and a nut 33b, abutting against the bottom surface of the top edge of the tub 31. The shank of screw 33a passes through an aperture 33c, which is made in cover 32 and on the top edge of tub 31 in order to be screwed into nut 33b. The shape of the head of screw 33a is suitable for manual handling. A sealing gasket, not shown, must also be provided at the contact between the top edge of tub 31 and cover 32 in order to seal container 30 hermetically.

Thermal container 30 also includes means 35 to 39 for introducing the reactive fluid, particularly oxygen inside tub 31, and heating means 40 and 41 for heating the interior of tub 31. The heating means are mainly composed of a heating body 41 arranged inside the container and a heating control device 40 which controls the heating body to obtain a desired temperature in container 30.

The means for introducing oxygen under pressure into the tub are formed by a three-way control valve 35, and an apparatus 36 for measuring the pressure inside container 30. A first pipe 37 of the three-way control valve 35 is connected to an oxygen bottle that is not shown for filling, via a second pipe 38 of valve 35, the container with oxygen at a pressure p when the first and second pipes are open and the third pipe 39 is closed. At the end of the first steps of the checking method, container 30 is depressurised by withdrawing the oxygen under pressure from the container. In order to do this, the second and third pipes 38 and 39 are open and the first pipe 37 is kept closed.

The first steps of the hermeticity checking method are explained more precisely hereinafter. First of all, several wafers 1' of micrometric components are placed in an open receptacle 43. This receptacle 43 carrying wafers 1' is then placed on a base 42 arranged on the bottom of tub 31 of container 30.

Container 30 is then hermetically sealed by closing means 33 by placing cover 32 abutting against the top edge of tub 31. Once container 30, which includes wafers 1' of micrometric components, is hermetically sealed, the first and second pipes 37 and 38 of valve 35 are open whereas the third pipe 39 is closed. In this manner, container 30 can be filled with oxygen at a determined pressure, which can be controlled by measuring apparatus 36. Of course, the valve can be controlled electronically so as to close all of pipes 37 to 39 when the oxygen inside the container is at the desired determined pressure.

The oxygen pressure in container 30 can be higher than 10 bars and preferably substantially equal to 15 bars or 20 bars. Thus, all of the micrometric components are subjected to high oxygen pressure. In this manner, the period of time necessary for introducing a detectable quantity of oxygen into each cavity and for guaranteeing an equalisation time greater than 20 years can be greatly reduced as explained hereinafter with reference to FIGS. 8 and 9.

In order to ensure that the oxygen introduced will react quickly with the copper indicator element, the container is heated by the heating means to a temperature higher than 100° C., for example 150° C. The determined time period for causing the copper layer to oxidise as the indicator element of each cavity, if the oxygen has penetrated the cavity, is thus reduced to several hours, or several days (65 hours). Since several wafers of approximately 5,000 components each are placed in the container, it is possible to carry out these first steps of the method for close to 500,000 micrometric components at the same time, which saves considerable time. Moreover, the optical measuring method on the wafer prior to the dicing step allows hermeticity to be checked quickly.

Figure 8:
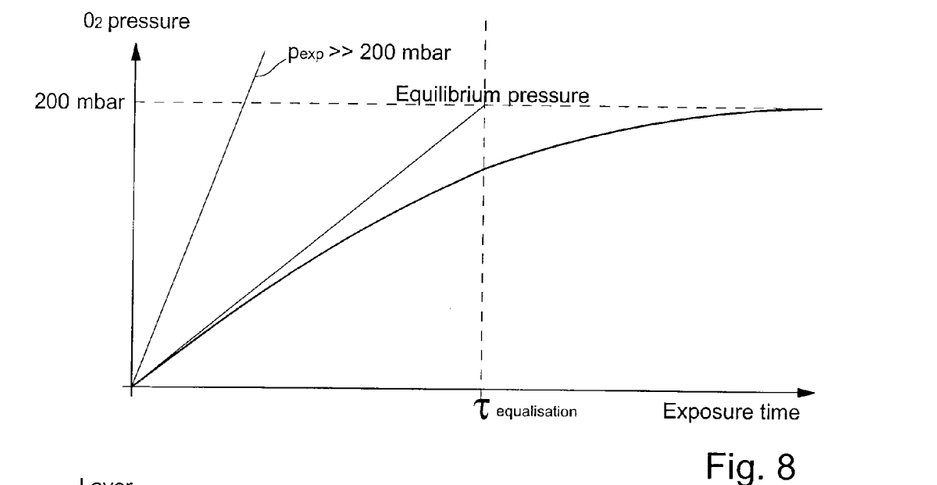
FIG. 8 shows a graph of the partial oxygen pressure as a function of exposure time in a closed cavity of a micrometric component for a method of checking hermeticity via optical means according to the invention.

In order to better understand the time saving obtained by the first steps of the method for ensuring the hermeticity of the closed cavity of the micrometric components, reference is made first of all to FIG. 8. FIG. 8 shows a graph of the partial oxygen pressure as a function of exposure time in a closed cavity of a micrometric component.

When the micrometric component is placed in a normal open air environment, said component is in the presence of approximately 20% oxygen, which corresponds to an oxygen partial pressure of 200 mbar at the equilibrium. Since the micrometric component cavity is filled only with an inert gas, such as argon, at a pressure of 800 mbar for example, there is thus a difference of 200 mbar of oxygen between the exterior and interior of the cavity. Consequently, if there is a leak in the cavity, the oxygen will gradually re-enter said cavity in an exponential asymptotic manner until there is an equilibrium of partial oxygen pressure.

As soon as the micrometric component is placed in the open air, the partial oxygen pressure inside the cavity as a function of time can be defined by the formula $p=p_0 \cdot (1-e^{(-t/T)})$. In this formula, $p_0$ is the oxygen pressure at the equilibrium, namely 200 mbar, and T is the exchange time constant determined by the leakage rate. This exchange time constant must be at least 20 years to ensure sufficient hermeticity for the cavity in most cases of micrometric components. The slope of the curve at the origin is thus defined by $p_0/T$. If the micrometric components in the closed container are subjected to an oxygen pressure of for example 20 bars, the slope at the origin is greater and the speed of introduction of oxygen is speeded up by a factor of 100.

It should be noted that the copper layer used as an indicator element in each cavity can oxidise in several hours in the presence of partial oxygen pressures greater than or equal to 1 mbar, i.e. approximately 100 times lower than the pressure at the equilibrium. Consequently, when the micrometric components are subjected to an oxygen pressure of 15 bars or 20 bars at a temperature of for example 120 or 150° C., the copper layer tends to oxidise simultaneously with the introduction of oxygen inside the cavity.

In each closed cavity of volume V close to 0.02 $mm^3$, the copper mass is approximately 1.03 ng with a copper layer with a diameter of 70 μm and a thickness of 30 nm. With this type of copper layer, $4.08 \cdot 10^{-12}$ mole of oxygen is sufficient to form a layer of copper oxide that can easily be detected in transmission. In order to guarantee an equalization time constant of 20 years with a partial ambient pressure of 200 mbar, the leakage rate defined by the formula $L=p_0 \cdot V/T$ is $6,34 \cdot 10^{-15}$ mbar·l/s. By molecular flux conversion defined by the formula $(dn/dt)=L/R \cdot T$ where R is 8.31 J/K·mole and T is 393 K, the oxygen leakage must be less than $1.94 \cdot 10^{-19}$ mole/s.

In a container at 20 bars oxygen, this leakage will be 100 times greater, i.e. $1.94 \cdot 10^{-17}$ mole/s. Thus, the micrometric component wafers need a little more than 58 hours of exposure in the container in order for the $4.08 \cdot 10^{-12}$ mole of oxygen necessary for quantifiable oxidisation of the copper layer to be able to be introduced. As described hereinbefore, at least 1 mbar of oxygen pressure has to be reached in the cavity, which means $4.9 \cdot 10^{-13}$ mole, corresponding to an additional dead time of 7 hours independently of the volume of the cavity. Thus, the micrometric component wafers must be left in the container under an oxygen pressure of 20 bars at a temperature of 120° C. for a determined time period of 65 hours.

After the determined time period, container 30 shown in FIG. 3 is depressurised by opening the second and third pipes 38 and 39, and cooled. Then the container is opened to take out receptacle 43 carrying wafers 1' for the optical checking operations in accordance with the method of the invention. These optical checking operations are explained in particular with reference to FIGS. 4 to 6 and 9.

Figure 4:
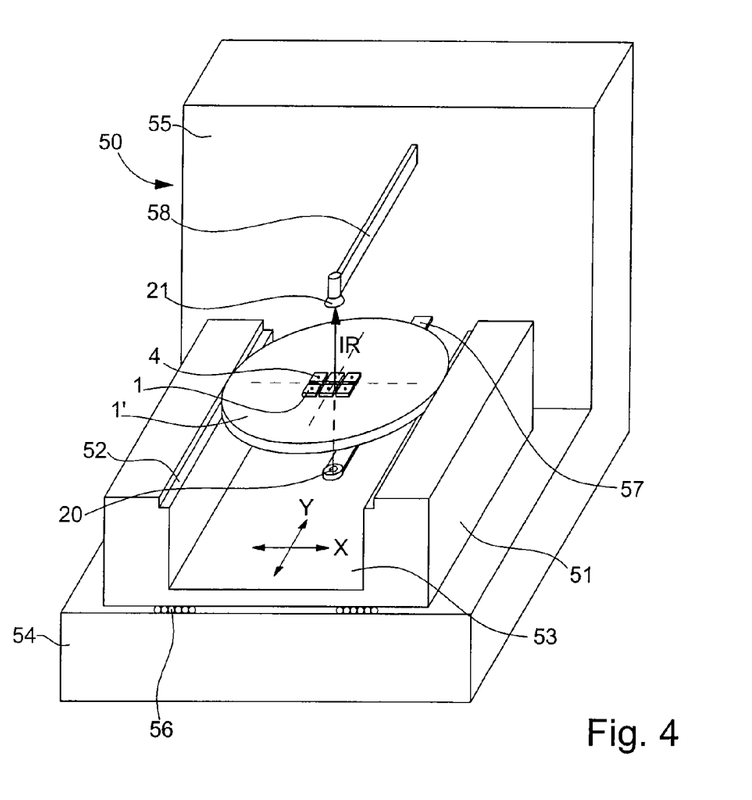
FIG. 4 shows in a simplified manner a three-dimensional view of a measuring machine for checking, via optical means, the indicator element of certain micrometric components of a wafer of components for implementing the hermeticity checking method according to the invention.

FIG. 4 shows a measuring machine 50 for checking, via optical means, the hermeticity of the cavity of at least certain components 1 of wafers 1'. All of the elements of the machine, which are well known in the technical field of optical checking, are shown in a very simplified manner. Of course, each element shown for optical measurement can be of a different shape from that shown in FIG. 4.

Measuring machine 50 includes a base 54 on which there is mounted a moving support 51 which can be moved along the X and Y directions. Schematically shown means 56 are used as a guide for moving support 51 on base 54. Moving support 51 includes a recess 53 at its centre giving it a U shape. One edge 52 on the side of recess 53 is made on the top part of moving support 51 in order to be able to position and hold a wafer 1' of micrometric components 1 to be checked. Wafer 1' is thus positioned at a distance from the low part of recess 53.

For the optical measurement, measuring machine 50 includes a light source 20 fixed to the free end of an arm 57, the other end of which is fixed to a front wall 55 of measuring machine 50. The measuring machine also includes an image sensor 21 fixed to the free end of an arm 58, the other end of which is fixed to the front wall of the machine. Electrical powering and data processing means, not shown, are arranged in the measuring machine.

Arm 57 carrying light source 20 at its free end is located in recess 53 provided on moving support 51 between the low part of the support and the back of wafer 1' to be checked. After micrometric component wafer 1' has been positioned using moving support 51 to check the indicator element 4 of one of components 1, light source 20 is switched on. This light source 20 provides at least one beam of light IR of a determined wavelength that passes perpendicularly through the wafer in one of the measuring zones of the positioned micrometric component 1. The image sensor positioned above wafer 1' receives light beam IR in order to determine the hermeticity of the component, as a function of the transparency or colour of the copper layer.

The wavelength of the light beam from the light source must be close to 850 nm in the near infrared if the substrate and each cap are made of glass, or close to 1.3 μm if the substrate and/or each cap are made of a semiconductor material, such as silicon. In the first case, LED diodes can be used (880 nm or 950 nm) or a semiconductor laser (780 nm) as light source 20 and a CCD type sensor as image sensor 21. In the second case, a 1.3 μm semiconductor laser is used and a suitable infrared imaging system as image sensor 21.

Figure 5:
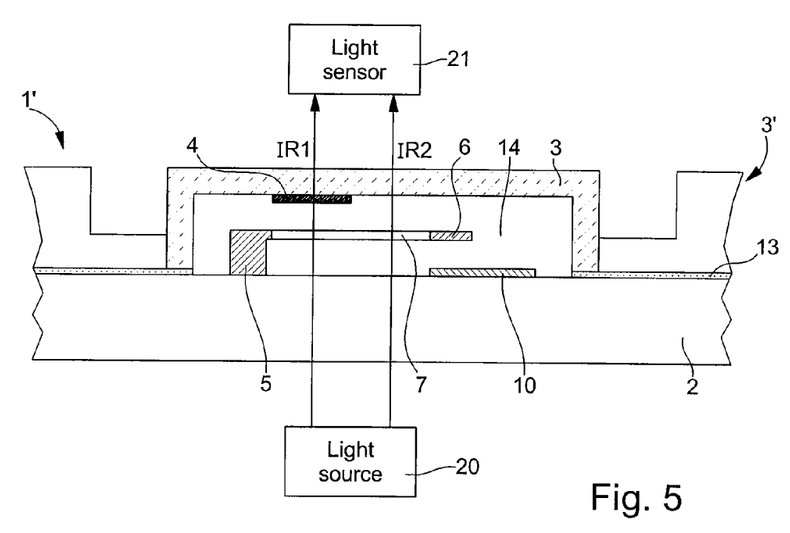
FIG. 5 shows schematically a partial cross-section of one part of a wafer of micrometric components of the first embodiment of FIG. 1, and checking means of the measuring machine for implementing the hermeticity checking method according to the invention.
Figure 6:
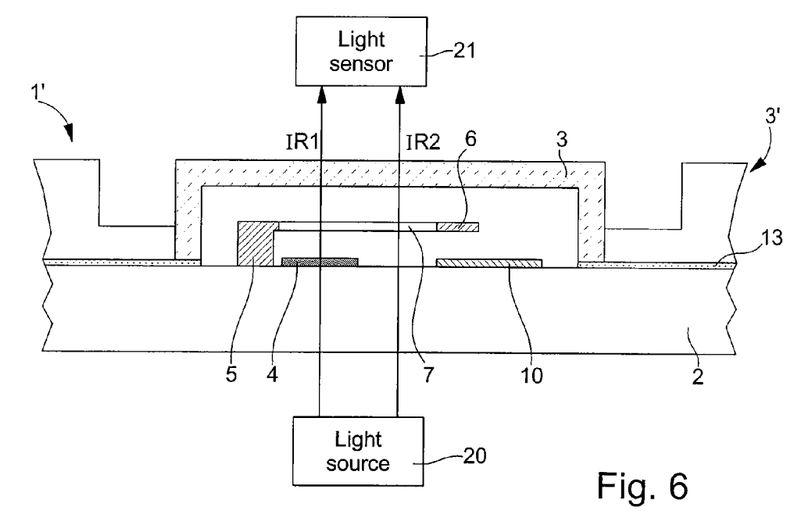
FIG. 6 shows schematically a partial cross-section of one part of a wafer of micrometric components of the second embodiment of FIG. 2, and checking means of the measuring machine for implementing the hermeticity checking method according to the invention.

Preferably, as shown in the two embodiments of FIGS. 5 and 6 a first light beam IR1 is emitted by the light source passes through one micrometric component 1 of wafer 1' passing through the first measurement zone of aperture 7 through copper layer 4 in order to be picked up by image sensor 21. After this, after wafer 1' has been moved, a second light beam IR2 emitted by the light source passes through said component passing through the second measurement zone of aperture 7 next to the copper layer. In this manner, a comparative optical measurement can be carried out. This comparative measurement can enable the data processing means to calculate a relative optical transmission ratio between an oxidised copper layer and a non-oxidised copper layer. Thus, a hermeticity check or a leakage rate of the component can be determined.

Figure 9:
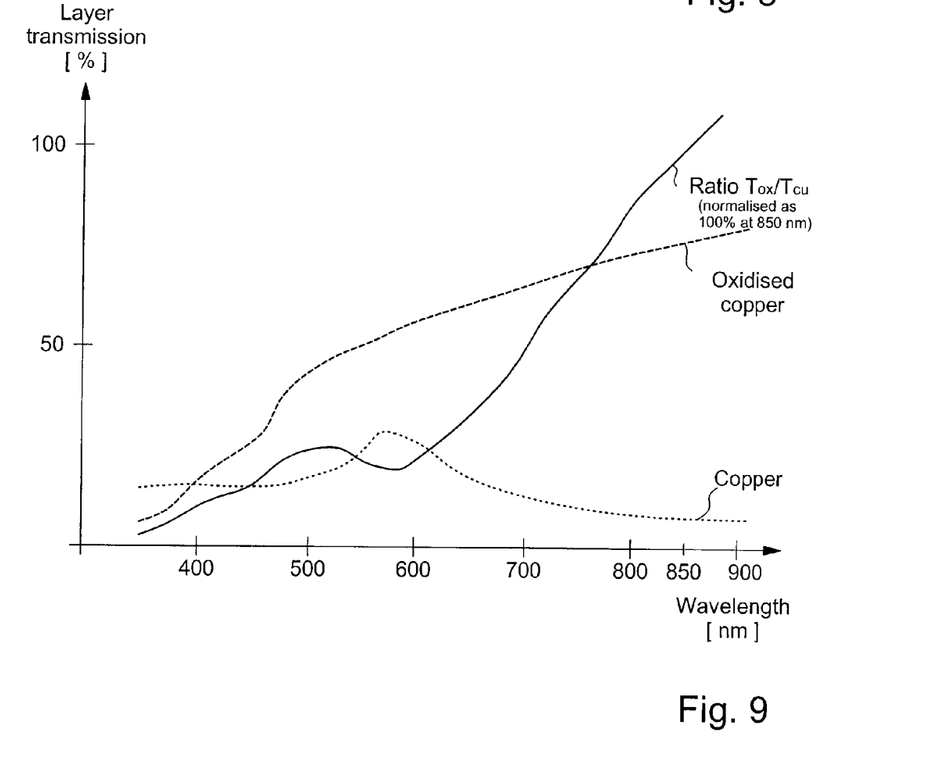
FIG. 9 shows graphs of the optical transmission of a layer of oxidised copper, of a non-oxidised layer and of the contrast ratio between layers of oxidised and non-oxidised copper as a function of the wavelength of a light beam passing through said layer for the method of checking via optical means according to the invention.

FIG. 9 shows an optical transmission graph of the copper layers of 30 nm thickness in an oxidised state or in a non-oxidised state as a function of the light beam wavelength. It is clear in FIG. 9 that the difference in transmission of a light beam through an oxidised copper layer and a non-oxidised copper layer increases with wavelength beyond 580 nm.

While the copper layer becomes increasingly opaque towards the infrared, the copper oxide becomes increasingly transparent, hence a high measurement contrast. By determining the transmission ratio Tox/Tcu between the oxidised copper layer and the non-oxidised copper layer, one obtains a reference defined at 100% at 850 nm wavelength of the light beam provided by the light source and picked up by the image sensor. It should be noted that the transmission ratio in the infrared is higher than 10, while in the green, this factor is less than 2.5.

Figure 7:
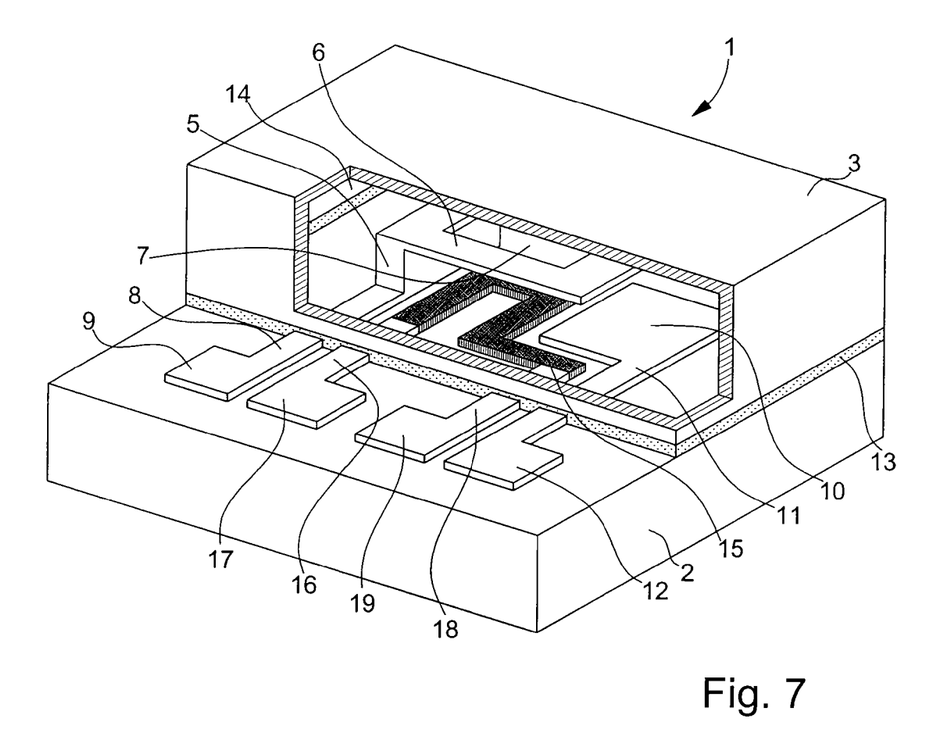
FIG. 7 shows a three-dimensional partial cross-section of a micrometric component with a micro-contactor, according to a third embodiment, in which an indicator element can be checked via electrical means for checking hermeticity.

FIG. 7 shows a third embodiment of a micrometric component 1 for implementing the method for checking hermeticity via electric means. It should be noted that those elements of FIG. 7, which are the same as those of FIGS. 1 and 2 bear identical reference signs. Consequently, for the sake of simplification, the description of these elements will not be repeated.

For checking the hermeticity of cavity 14 of micrometric component 1 via electric means, instead of the copper layer, there is provided a palladium resistor 15 housed entirely in said closed cavity. In order to have a significant resistor value capable of being easily measured by a measuring apparatus, the resistor describes a coil in the cavity. Of course, the length of the coil can be much greater than that illustrated in FIG. 7. This palladium resistor can be made by an electrolytic process, by chemical etching or any other known manner.

A third conductive path 16 connects a first end of resistor 15 to a third electric contact terminal 17 placed outside cavity 14 on substrate 2. A fourth conductive path 18 connects a second end of resistor 15 to a fourth contact terminal 19 placed outside cavity 14 on substrate 2. Each contact terminal 17 and 19 can be connected to contact terminals of an electronic circuit or to contact terminals of an electronic measuring apparatus, which are not shown.

The value of the palladium resistor has the ability to change in the presence of hydrogen as the reactive fluid. It should be noted that palladium has the property of absorbing at ambient temperature up to 900 times its volume of hydrogen. This corresponds to an atomic fraction of approximately 50%. Consequently, because of this palladium resistor 15 in cavity 14 of micrometric component 1 and the checking method described hereinbefore, it is possible to check the hermeticity of said closed cavity via electric means or to define a rate of leakage from said cavity.

Owing to the indicator elements placed in each cavity of the micrometric components of one or several wafers of components, it is possible to carry out indirect measurements via the accumulation in the indicator element of the reactive fluid that has penetrated the cavity. The indicator element in the cavity changes its optical or electric properties as a function of the reactive gas introduced into the cavity. This provides the advantage of enabling the same hermeticity checking method to be used for micrometric components have large or fine leaks from their cavity.

From the description that has just been given, multiple variants of the method for checking the hermeticity of a closed cavity of at least one micrometric component can be devised by those skilled in the art without departing from the scope of the invention defined by the claims. In the case of a check via optical means, a measurement of the copper layer can be carried out by the reflection of a light beam on the copper layer instead of transmission through the micrometric component. This copper layer can completely cover the inner surface of each cap and/or each inner zone of the substrate. Optical checking of the copper layer can be conducted using measuring means arranged in the container, or visually under a microscope for example.

The invention claimed is:

1. A method for checking the hermeticity of a closed cavity of at least one micrometric component which includes a structure made on or in a portion of a substrate and a cap fixed onto a zone of the substrate to protect the structure, the cavity being delimited by the inner surface of the cap, the structure, and the zone of the substrate, wherein the method includes steps of:

placing the micrometric component in a container, said component including inside the cavity an indicator element for checking hermeticity whose optical properties change permanently in the presence of a reactive fluid capable of reacting with the indicator element, hermetically sealing the container that contains said component, filling the container with a reactive fluid under pressure in order to subject said component to a higher fluid pressure to the pressure in the cavity for a determined time period, the container including means for introducing the reactive fluid, and checking the variation in the properties of the indicator element by optical means as a function of the quantity of reactive fluid that has penetrated the cavity and reacted with the indicator element to determine the hermeticity of said cavity.

2. The method according to claim 1, wherein several wafers that each include several micrometric components made on the same substrate and having a plate of caps fixed to the substrate to enclose each structure of micrometric components, are placed in the container to be placed under pressure by the reactive fluid introduced into the container for a determined time period.

3. The method according to claim 2, wherein the interior of the container filled with reactive fluid is heated to a temperature higher than the ambient temperature by heating means during the determined time period.

4. The method according to claim 1, wherein the cavity of the micrometric component or each cavity of micrometric components made on the same substrate of at least one wafer and having a plate of caps fixed to the substrate to enclose each micrometric component structure, includes an inert gas at a pressure close to the atmospheric pressure, and wherein the indicator element is a copper or titanium layer obtained by selective chemical etching or by selective deposition by evaporation under vacuum over one part of the inner surface of each cap or over one part of each zone of the substrate, wherein the container is filled with oxygen as the reactive fluid at a higher pressure than 10 bars so that the optical properties of the copper or titanium layer are altered by oxidisation as a function of the quantity of oxygen that has penetrated the cavity during the determined time period.

5. The method according to claim 4, wherein after the determined time period and before the operation of checking the optical properties of the copper or titanium layer, the container is depressurised and opened, wherein the micrometric component or at least one wafer of micrometric components is removed from the container and placed on a moving support of a measuring machine for the hermeticity check, and wherein for the hermeticity check, at least one light beam on a determined wavelength, which is emitted by a light source of the measuring machine, is directed towards the copper or titanium layer, so as to be picked up by an image sensor of the measuring machine by reflection of the light beam on the copper or titanium layer or by transmission of the light beam through the micrometric component passing through the copper or titanium layer, the substrate and/or the cap being transparent to the light beam on the determined wavelength.

6. The method according to claim 5, wherein the structure of each micrometric component is a magnetic microcontactor which includes a first conductive strip, one end of which is secured to the substrate by a conductive foot, and the other end of the first strip is free to move to come into contact with a second conductive strip fixed to the substrate in the presence of a magnetic field, an intermediate part of the first strip having an aperture extending over most of its length, the distance separating the foot of the first strip and one end of the second strip corresponding to the length of the aperture, and wherein the copper or titanium layer, which is at a distance from and opposite the aperture, has a thickness between 10 and 100 nm, and a surface dimension less than the surface dimension of the aperture to define through the aperture first and second measuring zones, wherein, for checking the optical properties of the copper or titanium layer, a first light beam emitted by the light source passes through the micrometric component passing through the first measurement zone through the copper or titanium layer to be picked up by the image sensor of the machine, wherein a second light beam emitted by the light source passes through the micrometric component passing through the second measurement zone without passing through the copper or titanium layer in order to be picked up by the image sensor, and wherein processing means of the measuring machine determine a leakage rate of the micrometric component cavity by comparing the luminous intensity of the first and second beams picked up by the image sensor.

7. The method according to claim 5, wherein the substrate and/or the cap of each micrometric component is made of silicon, wherein the first and second light beams are emitted by the light source with a wavelength of the order of 1.3 μm.

8. The method according to claim 5, wherein the substrate and/or the cap of each micrometric component is made of glass, wherein the first and second light beams are emitted by the light source in the near infrared range, close to 850 nm.

* * * * *